United States Patent
Mitra et al.

(10) Patent No.: US 11,335,674 B2
(45) Date of Patent: May 17, 2022

(54) DIODE TRIGGERED SILICON CONTROLLED RECTIFIER (SCR) WITH HYBRID DIODES

(71) Applicant: GLOBALFOUNDRIES U.S. INC., Santa Clara, CA (US)

(72) Inventors: Souvick Mitra, Essex Junction, VT (US); Robert J. Gauthier, Jr., Williston, VT (US); Alain F. Loiseau, Williston, VT (US); You Li, South Burlington, VT (US); Tsung-Che Tsai, Essex Junction, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 31 days.

(21) Appl. No.: 16/455,071

(22) Filed: Jun. 27, 2019

(65) Prior Publication Data

US 2020/0411504 A1     Dec. 31, 2020

(51) Int. Cl.
*H01L 27/02* (2006.01)

(52) U.S. Cl.
CPC ...... *H01L 27/0255* (2013.01); *H01L 27/0262* (2013.01)

(58) Field of Classification Search
CPC .................. H01L 27/0255; H01L 27/0262
USPC ........................................................ 257/355
See application file for complete search history.

(56) References Cited

U.S. PATENT DOCUMENTS

| | | |
|---|---|---|
| 6,815,732 B1 | 11/2004 | Vashchenko |
| 6,919,588 B1 | 7/2005 | Vashchenko |
| 6,933,573 B2 * | 8/2005 | Ker ............ H01L 21/84 257/355 |
| 7,471,493 B1 | 12/2008 | Huang et al. |
| 7,609,493 B1 * | 10/2009 | Salman ........... H01L 27/0255 361/111 |
| 9,461,032 B1 | 10/2016 | Edwards |
| 9,847,408 B1 | 12/2017 | Jain |
| 10,008,491 B1 * | 6/2018 | Li ............ H01L 27/0262 |
| 2002/0064007 A1 * | 5/2002 | Chang ........... H01L 27/0255 361/56 |
| 2003/0213971 A1 | 11/2003 | Yu |
| 2004/0051147 A1 | 3/2004 | Panday |
| 2004/0110353 A1 | 6/2004 | Mallikarjunaswamy |
| 2006/0231893 A1 * | 10/2006 | Bernstein ........... H01L 27/0922 257/347 |

(Continued)

FOREIGN PATENT DOCUMENTS

EP         2395620        12/2011

OTHER PUBLICATIONS

Dray et al., "ESD design challenges in 28nm hybrid FDSOI/Bulk advanced CMOS process", IEEE, Oct. 18, 2012, 7 pages.

(Continued)

*Primary Examiner* — Lex H Malsawma
*Assistant Examiner* — Eric W Jones
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to diode triggered Silicon controlled rectifiers and methods of manufacture. The structure includes a diode string comprising a first type of diodes and a second type of diode in bulk technology in series with the diode string of the first type of diodes.

20 Claims, 3 Drawing Sheets

(56) References Cited

U.S. PATENT DOCUMENTS

| | | | |
|---|---|---|---|
| 2007/0267700 A1* | 11/2007 | Russ | H01L 29/7391 |
| | | | 257/355 |
| 2008/0048215 A1 | 2/2008 | Davies | |
| 2009/0152587 A1 | 6/2009 | Cerati | |
| 2013/0075854 A1 | 3/2013 | Chang | |
| 2013/0242448 A1* | 9/2013 | Salcedo | H01L 27/0259 |
| | | | 361/111 |
| 2014/0131710 A1 | 5/2014 | Chung | |
| 2014/0138735 A1 | 5/2014 | Clarke | |
| 2015/0023105 A1 | 1/2015 | Widjaja | |
| 2015/0060939 A1 | 3/2015 | Di Sarro | |
| 2015/0236011 A1 | 8/2015 | Wang | |
| 2016/0173083 A1 | 6/2016 | Alexander | |
| 2016/0225755 A1 | 8/2016 | Wang | |
| 2017/0062406 A1 | 3/2017 | Ko | |
| 2017/0256535 A1 | 9/2017 | Nandakumar | |
| 2017/0287894 A1 | 10/2017 | Kuo | |
| 2017/0323882 A1 | 11/2017 | Langguth | |
| 2019/0181134 A1 | 6/2019 | Salman | |
| 2019/0319454 A1* | 10/2019 | Sithanandam | H01L 27/0255 |
| 2020/0083212 A1 | 3/2020 | Zhao | |
| 2020/0365716 A1 | 11/2020 | Chen | |

OTHER PUBLICATIONS

Galy et al., "Ultracompact ESD Protection With BIMOS-Merged Dual Back-to-Back SCR in Hybrid Bulk 28-nm FD-SOI Advanced CMOS Technology", IEEE, Oct. 2017, 7 pages.

Specification and Figures for related U.S. Appl. No. 16/810,076, filed Mar. 5, 2020, 24 pages.

Response to Office Action dated Oct. 15, 2021 in related U.S. Appl. No. 16/810,076, 8 pages.

Office Action dated Jul. 22, 2021 in related U.S. Appl. No. 16/810,076, 10 pages.

Final Office Action dated Feb. 7, 2022 in related U.S. Appl. No. 16/810,076, 12 pages.

Response to Final Office Action dated Apr. 5, 2022 in related U.S. Appl. No. 16/810,076, 9 pages.

* cited by examiner

DIODE TRIGGERED SILICON CONTROLLED RECTIFIER (SCR) WITH HYBRID DIODES

FIELD OF THE INVENTION

The present disclosure relates to semiconductor structures and, more particularly, to diode triggered silicon controlled rectifiers and methods of manufacture.

BACKGROUND

A Silicon Controlled Rectifier (SCR) is a semiconductor or integrated circuit (IC) that allows the control of current using a small current. A diode triggered SCR is a very useful ESD protection device due to trigger voltage tunability; however, diode triggered SCRs cannot be used for mid or high voltage electrostatic discharge (ESD) protection. This is due to the fact that the trigger voltage tunability does not scale with a number of trigger diodes.

For example, diode triggered SCRs are known to exhibit the Darlington effect which reduces the amount of current in each subsequent diode. In essence, the voltage dropped by each additional diode is reduced. Also, the leakage of the SCR is increased. Accordingly, there is a diminishing gain achieved with of additional diodes, which is caused by the Darlington effect.

SUMMARY

In an aspect of the disclosure, a structure comprises: a diode string comprising a first type of diodes; and a second type of diode in bulk technology in series with the diode string of the first type of diodes.

In an aspect of the disclosure, a structure comprises: multiple P+ and N+ regions forming a diode string without Darlington effect; and a single diode or string of diodes in bulk technology electrically connected to the diode string.

In an aspect of the disclosure, a structure comprises: a diode string comprising, in series, alternating P+ regions and N+ regions in semiconductor on insulator material; and a single diode or string of diodes in a bulk wafer electrically connected to a last N+ region of the diode string.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to diode triggered silicon controlled rectifiers (SCR) and methods of manufacture. More specifically, the present disclosure provides a diode triggered SCR with hybrid diodes. In embodiments, the hybrid diodes include diodes formed on both semiconductor on insulator (SOI) technologies (i.e., SOI diodes) and bulk substrate technologies (i.e., bulk diodes). Advantageously, the present disclosure provides a solution for mid-voltage low capacitance low leakage ESD protection.

In more specific embodiments, the diode triggered SCRs include a combination of trigger diodes in bulk and SOI technologies. The diode triggered SCRs are capable of maintaining trigger voltage tunability and scaling with any number of trigger diodes, thus offering an ESD protection solution for both mid or high voltage range. This is due to the fact that the diode triggered SCRs are able to mitigate the Darlington effect observed in known diode triggered SCRs. For example, the SOI diodes are capable of eliminating the Darlington effect as they are strictly two (2) terminal diodes. By avoiding the Darlington effect, the SOI diodes will exhibit lower leakage and higher voltage trigger (Vtrigger). On the other hand, the bulk diodes inject electrons into the substrate to facilitate triggering. In addition, the last diode of the diode string is a bulk diode and, hence, does not form a bulk diode string.

The diode triggered SCRs of the present disclosure can be manufactured in a number of ways using a number of different tools. In general, though, the methodologies and tools are used to form structures with dimensions in the micrometer and nanometer scale. The methodologies, i.e., technologies, employed to manufacture the diode triggered SCRs of the present disclosure have been adopted from integrated circuit (IC) technology. For example, the structures are built on wafers and are realized in films of material patterned by photolithographic processes on the top of a wafer. In particular, the fabrication of the diode triggered SCRs use three basic building blocks: (i) deposition of thin films of material on a substrate, (ii) applying a patterned mask on top of the films by photolithographic imaging, and (iii) etching the films selectively to the mask.

Figure 1:
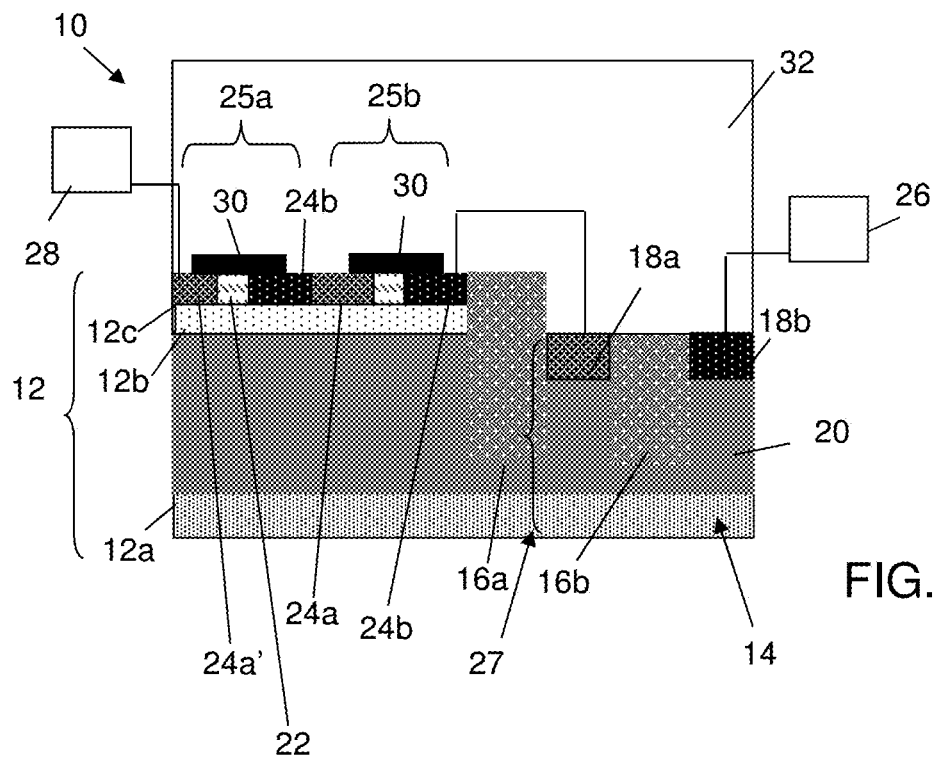
FIG. 1 shows stringed diodes and respective fabrication processes in accordance with aspects of the present disclosure.

FIG. 1 shows stringed diodes and respective fabrication processes in accordance with aspects of the present disclosure. In particular, the structure 10 includes SOI technology 12 and bulk technology 14. The SOI technology 12 includes two (2) terminal diodes 25a, 25b; whereas, the bulk technology includes a transistor 27 in a bulk wafer which acts as a diode. It should be understood by those of skill in the art that although two diodes 25a, 25b are shown in SOI technology, additional diodes are also contemplated herein. Although a single transistor 27 is shown, the use of additional transistors is contemplated herein.

In embodiments, the SOI technology 12 includes a substrate 12a, e.g., wafer, in addition to an insulator layer 12b and a semiconductor material 12c. The substrate 12a can be a p-type substrate, the insulator layer 12b can be a buried oxide material and the semiconductor material 12c can be any suitable semiconductor material. For example, the semiconductor material 12c may be composed of any suitable material including, but not limited to, Si, SiGe, SiGeC, SiC, GaAs, InAs, InP, and other III/V or II/VI compound semiconductors.

In further embodiments, the bulk technology 14 can be formed from the SOI technology 12. Specifically, the bulk technology 14 can be formed by etching or removing the insulator layer 12b and the semiconductor material 12c from the SOI technology 12, leaving the p-type substrate 12a. The insulator layer 12b and the semiconductor material 12c can be removed by conventional lithography and etching processes, e.g., reactive ion etching (RIE), using selective chemistries as should be understood by those of skill in the art.

Prior to forming the bulk technology 14, a plurality of shallow trench isolation regions 16a, 16b are formed using conventional lithography, etching and deposition processes. For example, a resist formed over the semiconductor material 12c is exposed to energy (light) to form a pattern (opening). An etching process with a selective chemistry, e.g., RIE, will be used to form one or more trenches in the insulator material 12b and substrate 12a, through the openings of the resist. Following the resist removal by a conventional oxygen ashing process or other known stripants, insulator material, e.g., oxide, can be deposited within the trenches by any conventional deposition processes, e.g., chemical vapor deposition (CVD) processes. Any residual material on the surface of the semiconductor material 12c can be removed by conventional chemical mechanical polishing (CMP) processes.

In embodiments, at least one shallow trench isolation region 16a will be formed between the SOI technology 12 and the bulk technology 14; whereas, at least one shallow trench isolation region 16b will be formed between a P+ region 18a and a N+ region 18b of the bulk technology 14. In embodiments, the shallow trench isolation region 16b will extend into a N-well 20 of the bulk technology 14, which can extend into the substrate 12a of the SOI technology 12. The P+ region 18a, N+ region 18b and the N-well 20 can be formed by conventional ion implantation processes known to those of skill in the art such that no further explanation is required for a complete understanding of the present disclosure. In embodiments, the P+ region 18a, N-well 20 and the p-type substrate 12a will form a PNP transistor 27 (which acts as a very low leakage diode) in the bulk technology 14. The PNP transistor 27 (e.g., diode 27) is a last diode of the diode string and, hence, does not form a bulk diode string. Accordingly, the diode 27 is capable of dropping a large voltage without the Darlington effect due to it receiving a large current.

Still referring to FIG. 1, by using conventional ion implantation processes known to those of skill in the art, a N-well 22 is formed in the semiconductor material 12c. Thereafter, alternating P+ regions 24a and N+ regions 24b are formed in the semiconductor material 12c, with a P+ region 24a and N+ region 24b of adjacent diodes 25a, 25b contacting one another. In this way, the adjacent diodes 25a, 25b are strictly two (2) terminal diodes in series, which can eliminate the Darlington effect. The shallow trench isolation region 16a separates the diodes 25a, 25b from the diode 27. A ground pad 26 electrically contacts the N+ region 18b and an I/O pad 28 electrically contacts the P+ region 24a'.

A silicide block layer 30 is formed over each of the diodes 25a, 25b, i.e., over the N-well 20 and contacting the respective P+ and N+ regions 24a, 24b. In embodiments, the silicide block layer 30 can be formed by conventional silicide processes. As should be understood by those of skill in the art, the silicide process begins with deposition of a thin transition metal layer, e.g., nickel, cobalt or titanium, over the diodes 25a, 25b. After deposition and patterning processes, the structure is heated allowing the transition metal to react with exposed silicon (or other semiconductor material as described herein) in the active regions of the semiconductor device (e.g., diodes 25a, 25b) forming a low-resistance transition metal silicide. Following the reaction, any remaining transition metal can be removed by chemical etching, leaving silicide contacts in the active regions of the device. The N+ region of the SOI diode 25b is electrically connected to the P+ region of the bulk diode 27. A dielectric layer 32 (e.g., oxide) can then be deposited over the diodes 25a, 25b, 27, with wiring connections between the pads, diodes, etc., embedded within the dielectric layer 32. It should be noted that, although the diodes 25a and 25b are shown bounded by silicide block, they could also be bounded with the FET gate material or any other available insulator.

Figure 2:
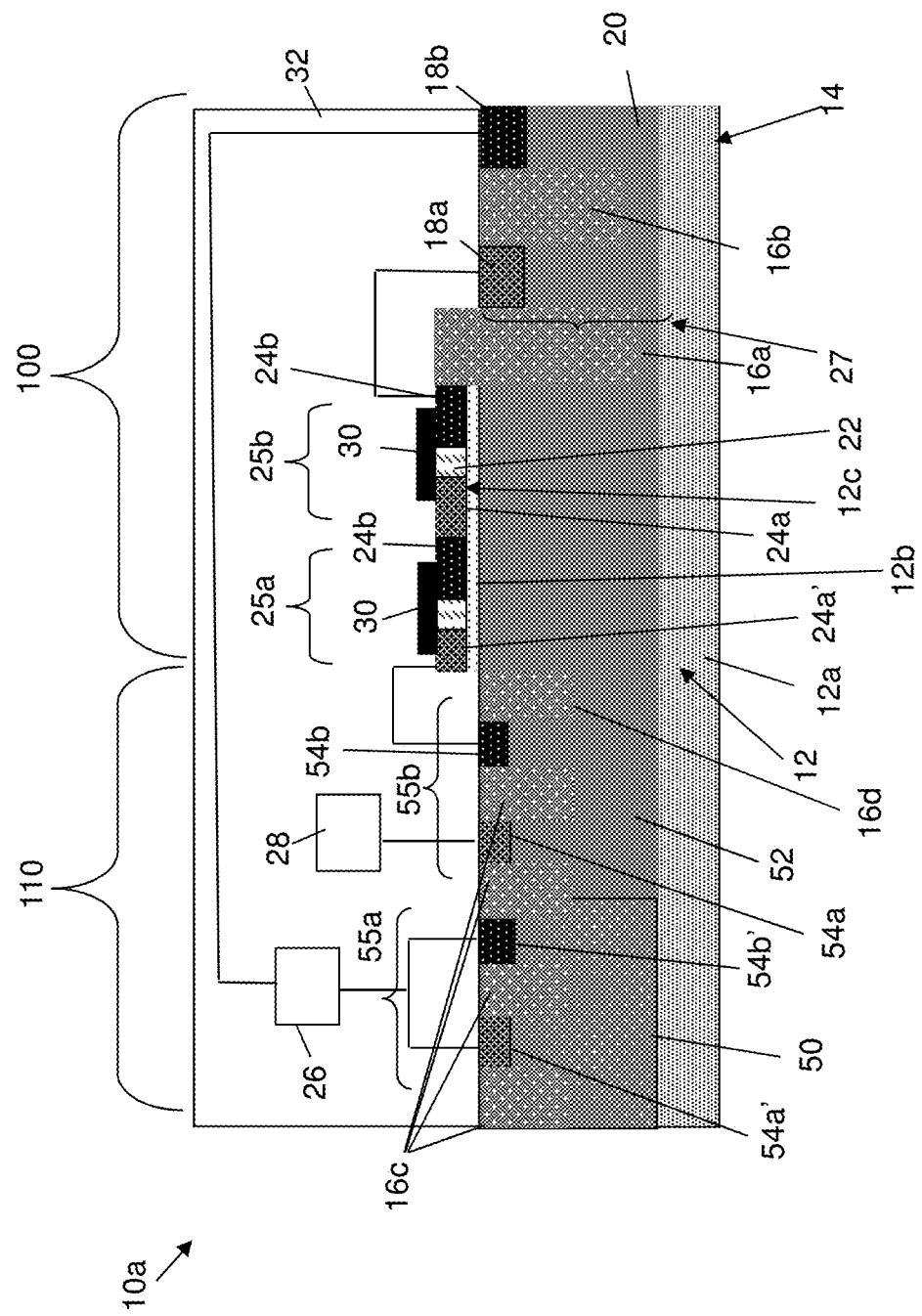
FIG. 2 shows the stringed diodes of FIG. 1 with a diode triggered silicon controlled rectifier (SCR) and respective fabrication processes in accordance with aspects of the present disclosure.

FIG. 2 shows the stringed diodes of FIG. 1 with a diode triggered silicon controlled rectifier (SCR) and respective fabrication processes. More specifically, the structure 10a of FIG. 2 show the stringed diodes 25a, 25b, 27 of FIG. 1 represented at reference numeral 100 and a SCR represented at reference numeral 110. As should be understood by one of skill in the art, the stringed diodes 25a, 25b and 27 will help trigger the SCR 110.

In embodiments, the SCR 110 is formed in bulk technology and includes a P-well 50 and a N-well 52 formed using conventional ion implantation processes as already described herein. Alternating P+ regions 54a and N+ regions 54b are formed in the respective P-well 50 and N-well 52, separated by shallow trench isolation regions 16c. In embodiments, the alternating P+ regions 54a and N+ regions 54b formed in the respective P-well 50 and N-well 52 form a PNP transistor 55a and NPN transistor 55b, respectively. A shallow trench isolation region 16d separates the SCR 110 from the stringed diodes 100 of FIG. 1.

The bulk technology, shallow trench isolation regions, the P+ regions (anodes), and the N+ regions (cathodes) are formed in the manner already described herein. In this embodiment, the ground pad 26 is connected to the P+ region 54a' and N+ region 54b' of the P-well 50, in addition to the N+ region 18b. Also, in this embodiment, the I/O pad 28 is connected to the P+ region (anode) 54a in the N-well 52. The SCR 110 and the stringed diode 25a are connected through the respective N+ region 54b of the SCR 110 and P+ region 24a of the diode 25a.

In operation using the structure 10a of FIG. 2, an ESD event on the I/O pad 28 will pass current through the P+ region 54a, N-well 52 and N+ region 54b to the stringed diodes 25a, 25b, 27. The current will pass through the bulk diode 27 and N+ region 18b to the ground pad 26. The current will then trigger the SCR 110. Once the SCR is triggered, most of the current from the P+ region (anode) 54a can flow backwards into the N+ region (cathode) 54b' of the P-well 50.

Figure 3:
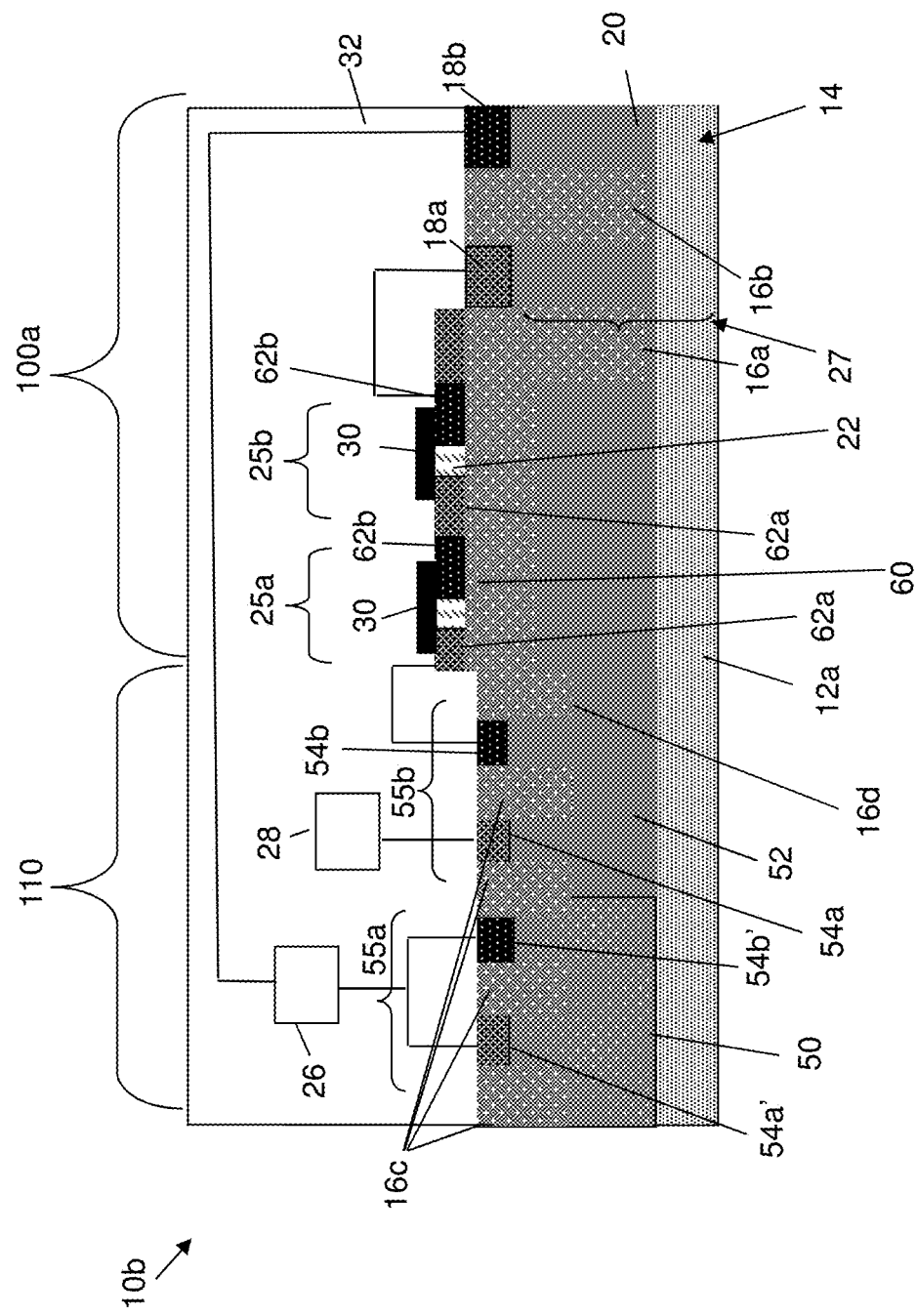
FIG. 3 shows the stringed diodes with a diode triggered silicon controlled rectifier (SCR) of FIG. 2 and respective fabrication processes in accordance with aspects of the present disclosure.

FIG. 3 shows stringed diodes with a diode triggered SCR 110 of FIG. 2 and respective fabrication processes. More specifically, the structure 10b of FIG. 3 includes a string of diodes 25a, 25b that are fabricated from doped gate material as represented by reference numerals 62a, 62b. That is, in this embodiment, the alternating P+ regions 24a and N+ regions 24b shown in FIG. 1 are replaced with doped gate material 62a, 62b. The doped gate material can be a P-doped poly material 62a and N-doped poly material 62b, separated by a N-well region 22. The P-doped poly material 62a and the N-doped poly material 62b can be formed on a gate dielectric material (also represented by reference numerals 62a, 62b). In embodiments, the gate dielectric material can be a high-k dielectric material such as hafnium oxide; although other dielectric materials are also contemplated herein. In addition, instead of using SOI technology, in this embodiment the doped gate material 62a, 62b is formed over a shallow isolation structure 60 formed in the N-well 20 of the bulk technology. In embodiments, the P-doped poly material 62a and a N-doped poly material 62b can be deposited and patterned using conventional deposition, lithography and patterning processes.

Figure 4:
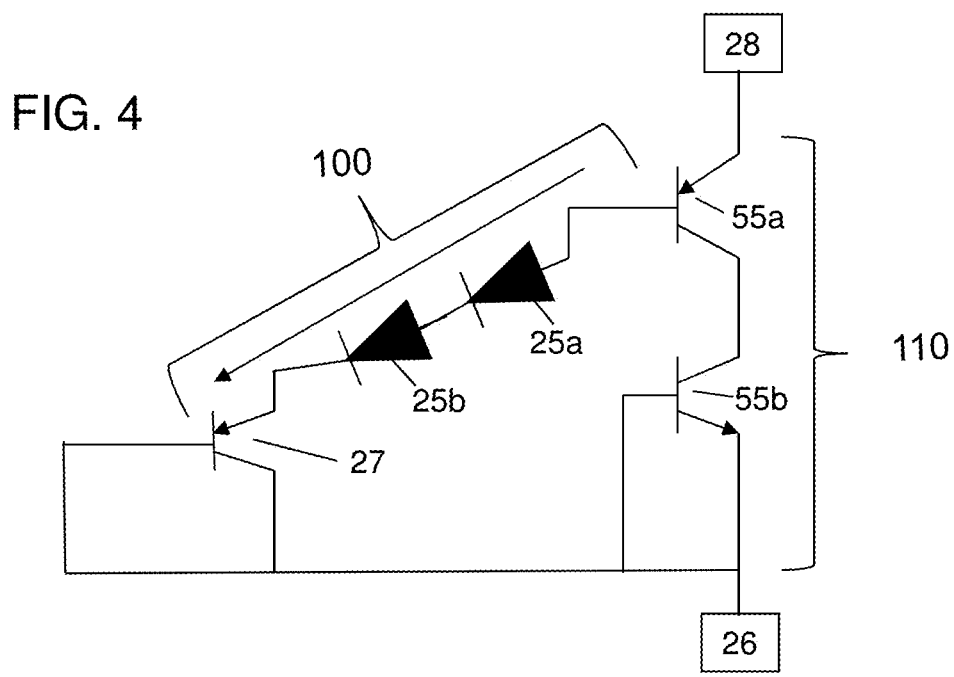
FIG. 4 shows a schematic diagram of a diode triggered silicon controlled rectifier (SCR) in accordance with aspects of the present disclosure.

FIG. 4 shows a schematic diagram of a diode triggered silicon controlled rectifier in accordance with aspects of the present disclosure. As shown in FIG. 4, the stringed diodes 25a, 25b, 27 are provided in series. The arrow represents the forward bias and drive current of the diodes 25a, 25b, 27. By using the diodes 25a, 25b in SOI technology, it is possible to avoid bipolar gain and hence the Darlington effect. Particularly, unlike conventional structures, there will be no leakage of the diodes 25a, 25b to ground, and hence there will be no diminishing gains by using additional diodes (which causes the Darlington effect). Also, by maintaining a fraction of the diodes in bulk allows for the injection of carriers into substrate which facilitates triggering.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a semiconductor on insulator (SOI) diode string over a well of a first dopant type, the SOI diode string comprising oppositely doped regions in contact with one another and within a semiconductor substrate over a buried insulator material, the first dopant type being in a bulk semiconductor material under the buried insulator material;
    a diode in the bulk semiconductor material comprising the well of the first dopant type in a same substrate material as the SOI diode string, and in series with the SOI diode string;
    a trench isolation structure extending into the well of the first dopant type and contacting buried insulator material of the SOI diode string such that the trench isolation structure isolates the diode from the SOI diode string; and
    a diode triggered silicon controlled rectifier (SCR) in the bulk semiconductor material, the SCR comprising the well of the first dopant type and a well of a second dopant type different than the well of the first dopant type, the SCR further comprising alternating P+ regions and N+ regions in each of the respective wells of the first dopant type and the second dopant type and separated by shallow trench isolation regions.

2. The structure of claim 1, wherein the SOI diode string comprises alternating P+ doped regions and N+ doped regions, in series, and one set of the alternating P+ regions and N+ regions of the SCR is connected to a second diode in the bulk semiconductor material through a ground pad.

3. The structure of claim 2, wherein the SOI diode string comprises at least two diodes, in series, and the P+ doped region of a first diode of the SOI diode string is in contact with the N+ doped region of a second diode of the SOI diode string and the trench isolation structure separates a P+ region of the diode in the bulk semiconductor material from the N+ region of the second diode of the SOI diode string, and
    a silicide block layer spans between the P+ region, an n-region and the N+ region of each of the first diode and the second diode of the SOI diode string.

4. The structure of claim 2, wherein the SOI diode string comprise two terminal diodes.

5. The structure of claim 1, wherein a N+ region of a last diode of the SOI diode string is electrically connected to the PNP transistor.

6. The structure of claim 1, wherein the PNP transistor is a last diode of a diode string.

7. The structure of claim 6, wherein the SCR is electrically coupled to the SOI diode string and isolated from one another in the bulk semiconductor material by the shallow trench isolation regions.

8. The structure of claim 7, wherein the SCR includes a PNP transistor and a NPN transistor, in series.

9. The structure of claim 1, wherein the SOI diode string comprises alternating P+ doped regions and N+ doped regions, in series, wherein the P+ doped region of a first diode is in contact with the N+ doped region of a second diode of the SOI diode string.

10. The structure of claim 9, wherein the alternating P+ doped regions and N+ doped regions are composed of doped gate material over a shallow trench isolation structure in bulk technology.

11. The structure of claim 1, wherein the diode string comprising the first type of diodes is structured to eliminate a Darlington effect.

12. The structure of claim 1, wherein each diode of the SOI diode string includes a P+ region and an N+ region separated by a n-well and completely over the insulator of the SOI and the oppositely doped regions comprise the P+ region of a first SOI diode in contact with the N+ region of an adjacent SOI diode.

13. The structure of claim 1, wherein the SOI diode string is on a first level and both the diode in the bulk semiconductor material and the SCR in the bulk semiconductor material on a second, lower level each of which are laterally offset laterally offset from the SOI diode string.

14. A structure comprising:
    alternating P+ regions and N+ regions of a same diode in direct contact with an n-region and forming a diode string without Darlington effect, with a P+ region being in contact with an adjacent N+ region of an adjacent diode, the alternating P+ regions, N+ regions and the n-region being in a semiconductor on insulator substrate, with an N-well in substrate material underneath insulator material; and
    a single diode or string of diodes in bulk technology electrically connected to the diode string, wherein the diode string and the single diode or the string of diodes in the bulk technology are in the N-well in the substrate material, and further comprising a trench isolation structure contacting the insulator material of the diode string and extending into the well of the same dopant type such that the trench isolation structure isolates the single diode or string of diodes from the diode string; and a silicide block contacting a top surface of the alternating P+ regions, N+ regions and n-well between the P+ regions and the N+ regions of the diode string; and a diode triggered silicon controlled rectifier (SCR) in the bulk technology, the SCR comprising the N-well and a P-well in the substrate material, the SCR further comprising alternating P+ regions and N+ regions formed in each of the N-well and the P-well, separated by shallow trench isolation regions.

15. The structure of claim 14, wherein alternating P+ regions and N+ regions are completely in semiconductor on insulator (SOI) technology to form a SOI diode string, in series, and further comprising:

a contact connecting the N+ region of the adjacent diode to a P+ region of the single diode or string of diodes in the bulk technology, with the trench isolation structure separating the N+ region of the adjacent diode and the P+ region of the single diode or string of diodes, wherein the N+ region of the adjacent diode and the P+ region of the single diode or string of diodes are on a different level than the diode string, with the P+ region being in the N-well shared with the diode string.

16. The structure of claim 15, wherein the SOI diode string two terminal diodes and the single diode is a last diode, wherein the P+ region and N+ region of each SOI diode in the SOI diode string are separated by an n-well of the SOI technology.

17. The structure of claim 16, wherein the single diode is a PNP transistor.

18. The structure of claim 17, further comprising a silicon controlled rectifier (SCR) electrically coupled to the SOI diode string.

19. The structure of claim 14, wherein the alternating P+ regions and N+ regions are P+ doped gate material and N+ gate material.

20. A structure comprising:

a semiconductor on insulator (SOI) diode string comprising, in series, each of which comprise a P+ region and a N+ region separated by and in direct contact with a n-well region in semiconductor on insulator material, where the P+ region and the N+ region of adjacent diodes of the SOI diode string directly contact with one another;

a single diode or string of diodes in a bulk wafer electrically connected to a last N+ region of the diode string;

a trench isolation structure contacting buried insulator material under the SOI diode string such that the trench isolation structure isolates the single diode or string of diodes from the SOI diode string; and a diode triggered silicon controlled rectifier (SCR) in the bulk wafer, the SCR comprising an N-well and a P-well in the bulk wafer, the SCR further comprising alternating P+ regions and N+ regions formed in each of the N-well and the P-well, separated by shallow trench isolation regions, wherein the SOI diode string and the single diode or the sting of diodes are located over a same well of a same dopant type which is in the bulk wafer under the buried insulator material, and the trench isolation structure extends into the same well of the same dopant type.

* * * * *